United States Patent
Koo et al.

(10) Patent No.: US 9,677,171 B2
(45) Date of Patent: Jun. 13, 2017

(54) METHOD OF IMPROVING ION BEAM QUALITY IN A NON-MASS-ANALYZED ION IMPLANTATION SYSTEM

(71) Applicant: Varian Semiconductor Equipment Associates, Inc., Gloucester, MA (US)

(72) Inventors: Bon-Woong Koo, Andover, MA (US); Christopher J. Leavitt, Gloucester, MA (US); John A. Frontiero, Rockport, MA (US); Timothy J. Miller, Ipswich, MA (US); Svetlana B. Radovanov, Brookline, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 78 days.

(21) Appl. No.: 14/298,251

(22) Filed: Jun. 6, 2014

(65) Prior Publication Data

US 2015/0354056 A1    Dec. 10, 2015

(51) Int. Cl.
    *C23C 14/48*    (2006.01)
    *C23C 14/56*    (2006.01)
    *H01J 27/00*    (2006.01)

(52) U.S. Cl.
    CPC ............ *C23C 14/48* (2013.01); *C23C 14/564* (2013.01); *H01J 27/00* (2013.01)

(58) Field of Classification Search
    CPC ..................................................... C23C 14/48
    See application file for complete search history.

(56) References Cited

U.S. PATENT DOCUMENTS

| | | | |
|---|---|---|---|
| 2005/0051272 A1* | 3/2005 | Collins ................. | H01J 37/321 156/345.48 |
| 2009/0068783 A1* | 3/2009 | Borden ............. | H01L 31/02242 438/57 |

OTHER PUBLICATIONS

Peter F. Kurunczi, et al., Method for Implant Productivity Enhancement, U.S. Appl. No. 14/090,001, filed Nov. 26, 2013.

* cited by examiner

*Primary Examiner* — Dah-Wei D Yuan
*Assistant Examiner* — Kristen A Dagenais
(74) *Attorney, Agent, or Firm* — Nields, Lemack & Frame, LLC

(57) ABSTRACT

A method of processing a workpiece is disclosed, where the plasma chamber is first coated using a conditioning gas and optionally, a co-gas. The conditioning gas, which is disposed within a conditioning gas container may comprise a hydride of the desired dopant species and a filler gas, where the filler gas is a hydride of a Group 4 or Group 5 element. The remainder of the conditioning gas container may comprise hydrogen gas. Following this conditioning process, a feed-gas, which comprises fluorine and the desired dopant species, is introduced to the plasma chamber and ionized. Ions are then extracted from the plasma chamber and accelerated toward the workpiece, where they are implanted without being first mass analyzed. In some embodiments, the desired dopant species may be boron.

16 Claims, 3 Drawing Sheets

METHOD OF IMPROVING ION BEAM QUALITY IN A NON-MASS-ANALYZED ION IMPLANTATION SYSTEM

FIELD

Embodiments of the present disclosure relate to methods for improving ion beam quality in a non-mass-analyzed ion implantation system, and more particularly, improving boron ion beam quality.

BACKGROUND

Semiconductor workpieces are often implanted with dopant species to create a desired conductivity. For example, solar cells may be implanted with a dopant species to create an emitter region. This implant may be done using a variety of different mechanisms. In one embodiment, an ion source is used. This ion source may include a plasma chamber in which source gasses are ionized. The ions from these source gasses may be extracted through an aperture in the plasma chamber, using one or more electrodes. These extracted ions are directed toward a workpiece, where they are implanted in the workpiece to form the solar cell.

In an effort to improve process efficiency and lower cost, in some embodiments, the ions extracted from the ion source are accelerated directly toward the workpiece, without any mass analysis. In other words, the ions that are generated in the ion source are accelerated and implanted directly into the workpiece. A mass analyzer is used to remove undesired species from the ion beam. Removal of the mass analyzer implies that all ions extracted from the ion source will be implanted in the workpiece. Consequently, undesired ions, which may also be generated within the ion source, are then implanted in the workpiece.

This phenomenon may be most pronounced when the source gas is a halogen-based compound, such as a fluoride. Fluorine ions and neutrals (metastable or excited) may react with the inner surfaces of the ion source, releasing unwanted ions and neutrals, such as silicon, fluorine, oxygen, carbon, and aluminum and heavy metals present as impurity elements.

Therefore, a method that improves beam quality, particularly for embodiments in which halogen based boron-containing source gasses are employed, would be beneficial.

SUMMARY

A method of processing a workpiece is disclosed, where the plasma chamber is first coated using a conditioning gas and optionally, a co-gas. The conditioning gas, which is disposed within a conditioning gas container, may comprise a hydride of the desired dopant species and a filler gas, where the filler gas is a hydride of a Group 4 or Group 5 element. The remainder of the conditioning gas container may comprise hydrogen gas. Following this conditioning process, a feedgas, which comprises fluorine and the desired dopant species, is introduced to the plasma chamber and ionized. Ions are then extracted from the plasma chamber and accelerated toward the workpiece, where they are implanted without being first mass analyzed. In some embodiments, the desired dopant species may be boron.

According to one embodiment, a method of processing a workpiece is disclosed. The method comprises performing a conditioning process, the conditioning process comprising: introducing a conditioning gas into a plasma chamber of an ion source from a conditioning gas container, the conditioning gas disposed in the conditioning gas container comprising a hydride containing a desired dopant species and a filler gas, where the filler gas comprises a hydride of a Group 4 element or a hydride of a species having an opposite conductivity of the desired dopant species; and ionizing the conditioning gas in the plasma chamber so as to form a coating on walls of the plasma chamber; and performing an ion implantation process after the conditioning process, the ion implantation process comprising: introducing a feedgas into the plasma chamber from a feedgas container after the coating is formed, the feedgas comprising fluorine and the desired dopant species; ionizing the feedgas in the plasma chamber to create ions; and extracting the ions from the plasma chamber and accelerating the ions toward the workpiece, such that the ions are implanted into the workpiece without mass analysis.

According to another embodiment, a method of processing a workpiece is disclosed. The method comprises performing a conditioning process, the conditioning process comprising: introducing a conditioning gas into a plasma chamber of an ion source from a conditioning gas container, the conditioning gas disposed in the conditioning gas container comprising a borane and a filler gas, where the filler gas comprises a hydride of a Group 4 element or a hydride of a Group 5 element; and ionizing the conditioning gas in the plasma chamber so as to form a coating on walls of the plasma chamber, wherein the coating comprises boron and the Group 4 or 5 element; and performing an ion implantation process after the conditioning process, the ion implantation process comprising: introducing a feedgas into the plasma chamber from a feedgas container after the coating is formed, the feedgas comprising fluorine and boron; ionizing the feedgas in the plasma chamber to create ions; and extracting the ions from the plasma chamber and accelerating the ions toward the workpiece.

According to another embodiment, a method of coating the walls of a plasma chamber in an ion source is disclosed. The method comprises: providing conditioning gas in a conditioning gas container, wherein the conditioning gas comprises diborane and a filler gas, the filler gas comprising a hydride of a Group 4 element or a hydride of a Group 5 element; introducing the conditioning gas from the conditioning gas container into the plasma chamber; and ionizing the conditioning gas so as to form a plasma, wherein ions from the plasma coat the walls of the plasma chamber with boron and the Group 4 or 5 element.

BRIEF DESCRIPTION OF THE FIGURES

For a better understanding of the present disclosure, reference is made to the accompanying drawings, which are incorporated herein by reference and in which.

DETAILED DESCRIPTION

As described above, ionization of halogen-based species, such as fluorides, may cause particles released from the inner surfaces of the ion source to be implanted in the workpiece. These contaminants may include aluminum, carbon, nitrogen, oxygen, silicon, fluorine-based compounds, and other unwanted species (including heavy metals present as impurity elements). One approach to address the damage caused by free halogen ions may be to introduce at least one additional source gas during implantation. Another approach may be to condition the plasma chamber walls of the ion source prior to the ion implantation process.

Figure 1A:
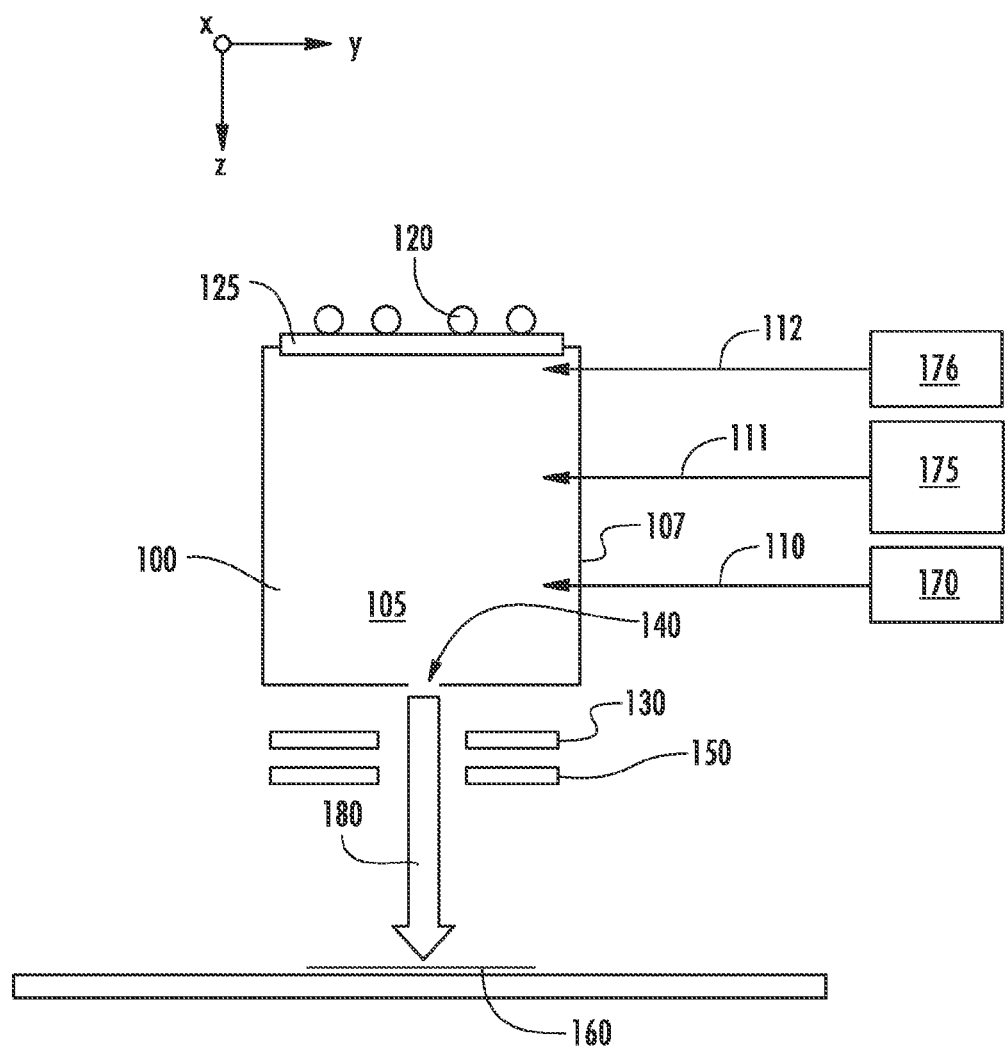
FIGS. 1A-1B show the implant system according to different embodiments.
Figure 1B:
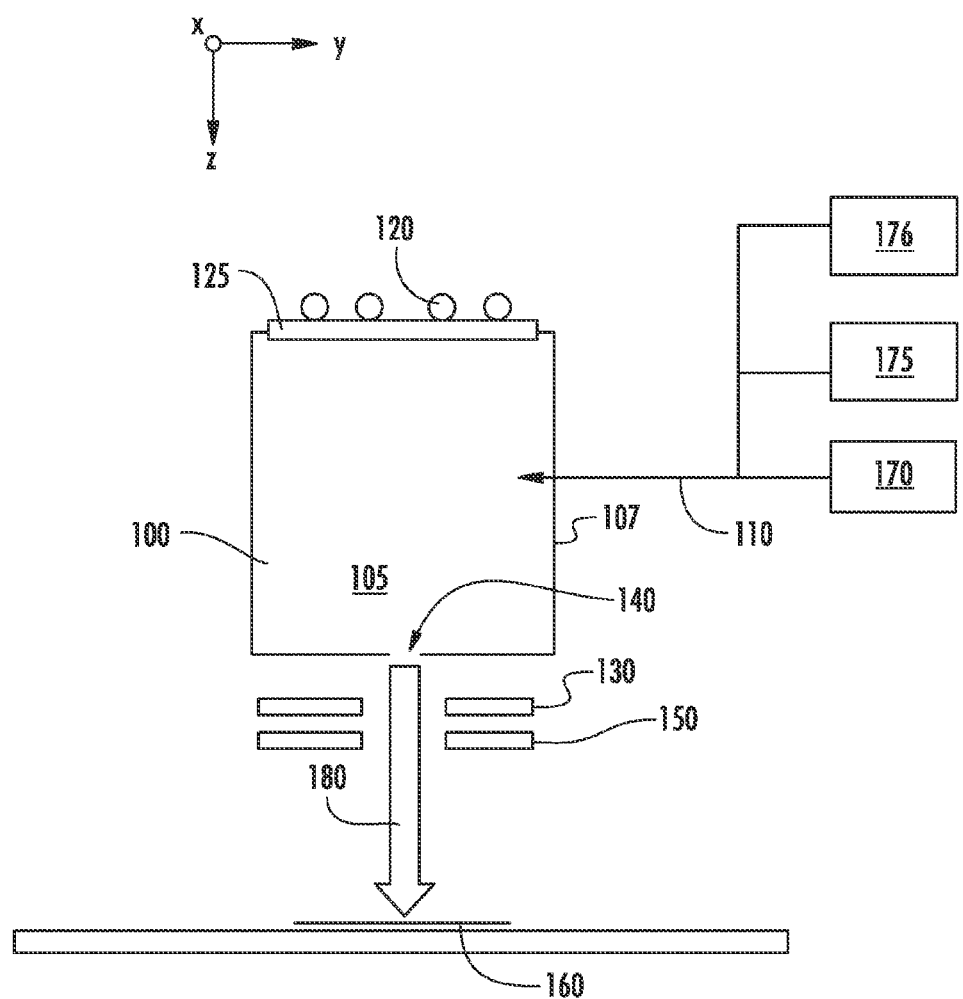

FIGS. 1A-1B show various embodiments in which a second source gas and optionally a third source gas may be introduced to a plasma chamber 105 of an ion source 100. In each of these figures, the ion source 100 includes a plasma chamber 105 defined by several plasma chamber walls 107, which may be constructed from graphite or another suitable material. This plasma chamber 105 may be supplied with one or more feedgasses, stored in a feedgas container 170, via a gas inlet 110. This feedgas may be energized by an RF antenna 120 or another plasma-generation mechanism. The RF antenna 120 is in electrical communication with a RF power supply (not shown) which supplies power to the RF antenna 120. A dielectric window 125, such as a quartz or alumina window, may be disposed between the RF antenna 120 and the interior of the plasma chamber 105. The ion source 100 also includes an aperture 140 through which ions may pass. A negative voltage is applied to extraction suppression electrode 130 disposed outside the aperture 140 to extract and focus the positively charged ions from within the plasma chamber 105 through the aperture 140 and toward the workpiece 160. A ground electrode 150 may also be employed. In some embodiments, the aperture 140 is located on the side of the ion source 100 opposite the side containing the dielectric window 125. Ions extracted from the plasma chamber 105 are formed into an extracted ion beam 180, which is directed toward the workpiece 160. As described above, no mass analyzer is used to filter out the unwanted ions before they strike the workpiece 160. In one particular embodiment, shown in FIG. 1A, the second source gas may be stored in a conditioning gas container 175 and introduced to the plasma chamber 105 through a second gas inlet 111. The third source gas may be stored in a third gas container 176 and introduced to the plasma chamber 105 through a third gas inlet 112. In another embodiment, shown in FIG. 1B, the second source gas may be stored in a conditioning gas container 175 and the third source gas may be stored in a third gas container 176. Both the second source gas and the third source gas may be introduced to the plasma chamber 105 through the same gas inlet 110 used by the first source gas.

In any of these embodiments, the first source gas, the second source gas and the third source gas may be introduced simultaneously or sequentially to the plasma chamber 105. It should be noted that in some embodiments, more or less than three source gasses may be used. For example, in some embodiments, the third source gas, disposed in third gas container 176, is not used.

FIGS. 1A-1B utilize an ion source having a RF antenna 120 and an RF power supply to generate the necessary ions. However, it can be appreciated that other types of ion sources may be used including IHC, hollow-cathode, helicon, and microwave ion source. For example, an indirectly heated cathode (IHC) which uses heat to cause thermionic emission of electrons may also be used in some embodiments. Other ion sources are also within the scope of the disclosure.

The first source gas, also referred to as the feedgas, may comprise a dopant, such as boron, in combination with a halogen, such as fluorine. Thus, the feed gas may be in the form of $DF_n$ or $D_mF_n$, where D represents the dopant atom, which may be boron, gallium, phosphorus, arsenic or another Group 3 or Group 5 element. This first source gas may be disposed within feedgas container 170.

The second source gas, also referred to as the conditioning gas, may be disposed in conditioning gas container 175 and comprises a mixture including molecules having a chemical formula of $DH_n$ or $D_mH_n$, where H is hydrogen, and one or more filler gasses. D may be a dopant species, such as any of those described above. In embodiments where the dopant is boron, the conditioning gas may include a borane, where the filler gas is typically hydrogen gas. Boranes, and specifically diborane, are not stable and therefore are usually stored in gas containers with a large amount of hydrogen gas to improve their molecular stability. Otherwise, diborane quickly decomposes to form solid boron and hydrogen. In some embodiments, conditioning gas container 175 may contain between 15-30% diborane with the remainder being hydrogen gas.

In other words, the feedgas may be $BF_3$ or $B_2F_4$, while the conditioning gas may be, for example, a mixture of hydrogen gas and $B_2H_6$. It is understood that other feedgas species and conditioning species are also possible.

In other embodiments, the conditioning gas stored in conditioning gas container 175 may be diborane mixed with hydrogen gas and at least one additional filler gas, such as a hydride of a Group 4 or Group 5 element, including but not limited to phosphine ($PH_3$), silane ($SiH_4$), disilane ($Si_2H_6$) and germane ($GeH_4$). In these embodiments, the mixture within the conditioning gas container 175 may be 15-30% diborane, 10-30% filler gas, with the remainder being hydrogen gas. In some embodiments, less than 60% of the conditioning gas is made up of hydrogen gas. In other embodiments, less than 50% of the conditioning gas is made up of hydrogen gas.

The third source gas, referred to as the co-gas, may be disposed in third gas container 176. In some embodiments, the co-gas may be a noble gas, such as helium, argon, krypton or xenon. In other embodiments, the co-gas may be a hydride containing a Group 4 element, such as but not limited to silicon (i.e. silane, $SH_4$ or disilane, $Si_2H_6$ or germanium (i.e. germane, $GeH_4$). In yet other embodiments, the co-gas may be a hydride containing a species of the opposite conductivity as the desired dopant. In other words, if the feedgas contains boron, a hydride containing a Group 5 element may be used as the co-gas. The co-gas, in this scenario, may be phosphine ($PH_3$) or arsine ($AsH_3$). It is noted that in some embodiments, the third source gas is not used. In some embodiments, the co-gas may be the same species as the filler gas.

This combination of three source gasses can be used in two different modes in the ion source 100. In a first mode, known as ion implantation mode, a plasma of the desired dopant is created in the ion source 100. Ions of the desired dopant are then extracted from the ion source 100 and accelerated toward the workpiece 160. In a second mode, or conditioning mode, a plasma is created. However, the purpose of the conditioning mode is not to implant the workpiece 160. Rather, conditioning is a process where material is coated onto the inner surfaces of the plasma chamber walls 107. This material may serve to protect the plasma chamber walls 107 from the deleterious effects of halogens, reducing the amount of contaminants that are etched from the plasma chamber walls 107 and introduced into the extracted ion beam 180.

Conditioning may be performed in a number of ways. In a first embodiment, conditioning is performed in the same manner as implantation. In other words, a plasma is generated within plasma chamber 105 using energy from the RF antenna 120 or other plasma generator. Ions from that plasma are then extracted from the plasma chamber 105 through application of bias voltages to the electrodes 130, 150. During this time, ions and excited or metastable neutrals from the plasma that are not extracted may be deposited on the plasma chamber walls 107 of the plasma chamber 105, as well as the dielectric window 125.

In a second embodiment, the bias voltages are not applied to the electrodes 130, 150. Alternatively, a positive voltage can be applied to electrodes 130 to repel the ions away from the aperture 140. In this way, the plasma and the ions remain within the plasma chamber 105. Again, ions and excited or metastable neutrals from the plasma may be deposited on the plasma chamber walls 107 of the plasma chamber 105, as well as the dielectric window 125.

In either embodiment, the generation of this plasma produces ions and excited neutrals, some of which attach to the inner surfaces of the plasma chamber walls 107, creating a coating on those surfaces. This conditioning process may be performed for between 30 minutes and 6 hours. This process may be repeated periodically, such as every 24 hours, although the amount of time is not limited by this disclosure. In other embodiments, this conditioning process may be performed until a coating of a certain thickness has been created.

The use of multiple source gasses allows variations in both the conditioning process and the ion implantation process. For example, by combining the feedgas with the conditioning gas in the ion implantation process, the deleterious effects of the fluorine ions may be reduced. For example, without being limited to any particular theory, the introduction of hydrogen, in the form of hydrogen molecules or hydrides, may create a film or coating on the dielectric window 125. This may serve to protect the dielectric window 125, which reduces the amount of contaminants originating from the dielectric window 125 that are contained in the extracted ion beam 180. In addition, the conditioning gas may coat the inner surfaces of the plasma chamber walls 107, which may be another source of contaminants. This coating may reduce the interaction between fluorine ions and the inner surfaces of the plasma chamber walls 107, reducing the amount of contaminants generated.

The introduction of a conditioning gas may reduce the creation of contaminants and the incorporation of these contaminants in the ion beam.

In one embodiment, the ion implantation process is performed using a combination of the feedgas in the feedgas container 170 and the conditioning gas in the conditioning gas container 175. In another embodiment, the ion implantation process is performed using a combination of the feedgas and the co-gas disposed in the third gas container 176. As described above, the addition of other ions, such as hydrogen, germanium, phosphorus or silicon, may reduce the deleterious effect of halogens on the plasma chamber walls 107 and the dielectric window 125.

In a third embodiment, the ion implantation process is performed using a combination of the feedgas, the conditioning gas and the co-gas. The amount of each gas can be tuned to achieve the desired beam current while remaining below a predetermined contaminant level.

As stated above, the addition of at least a second source gas (which may be the conditioning gas, the co-gas or both) may reduce the amount of contaminants introduced into the ion beam.

Thus, an extracted ion beam 180 having reduced beam impurity can be created by using at least two source gasses. The first source gas, or feedgas, may be a species than contains both boron and fluorine, such as $BF_3$ or $B_2F_4$. The second source gas may be the conditioning gas, which is comprised of hydrogen gas, a borane, and a filler gas, where the filler gas is a hydride of a Group 4 or Group 5 element. Alternatively, the second gas may be the co-gas, which is a hydride of a Group 4 or Group 5 element. In some embodiments, the second source gas may comprise both the conditioning gas and the co-gas.

These two source gasses are introduced into a plasma chamber 105 of an ion source 100, either simultaneously or sequentially, where they are ionized. The ion source may use RF energy generated by RF antenna 120. In another embodiment, the ion source may utilize the thermionic emission of electrons using an IHC. Other methods of ionizing a gas may also be used by the ion source. These two source gasses may be introduced such that between 60-95% of the total gas (by volume) is feedgas, while the remainder is the second source gas with the amount of 5-40% of the total gas (by volume). Ions from both source gasses are extracted through aperture 140 through use of electrodes 130, 150 and accelerated toward a workpiece 160, where they are implanted into the workpiece 160. As described earlier, these ions are not mass analyzed, meaning that all extracted ions are implanted into the workpiece 160.

As described above, the ion source 100 may also operate in a conditioning mode. For example, the inner surfaces of the plasma chamber walls 107 of the ion source 100 may be conditioned prior to the implant process. The conditioning gas is introduced into the plasma chamber during the conditioning mode.

In some embodiments, the conditioning gas comprises a hydride containing the desired dopant species, which is used to condition the plasma chamber walls 107 and the dielectric window 125. The desired dopant species may be the dopant that is to be used during the subsequent ion implantation process. In other words, in scenarios where the feedgas includes boron, which is to be implanted into the workpieces during the ion implantation process, a borane may be used as the conditioning gas during the conditioning process. This borane may be diborane ($B_2H_6$), pentaborane ($B_5H_9$), decaborane ($B_{10}H_{14}$), or any other borane. If a different dopant is to be implanted, a different hydride may be used as the conditioning gas.

As described above, diborane is unstable (at room temperature or general operating temperatures) and is therefore traditionally stored with hydrogen gas, typically in ratios of 30% or less (diborane to total volume). In this embodiment, the conditioning gas may be a mixture of diborane and hydrogen gas. In another embodiment, the conditioning gas container 175 is filled with a mixture of gasses, which includes up to 30% diborane, 10-30% filler gas, and the remainder being hydrogen gas. In some embodiments, less than 50% of the conditioning gas is made up of hydrogen gas. As described above, the filler gas is a hydride of a Group 4 or Group 5 element, which contributes to the stability of diborane in the absence of pure hydrogen gas.

In some embodiments, the co-gas is also introduced during the conditioning process. The co-gas may facilitate better ignition of the plasma, as compared to using only the conditioning gas. The use of a co-gas yields multiple benefits, such as better ignition of the plasma at lower gas amounts than diborane-only, and a stronger protective film on the plasma chamber walls. This enables the ion implantation process to be performed for longer periods of time, which improves productivity.

The amount of co-gas may be varied. For example, in some embodiments, the co-gas may be between 10-40% of the total gas introduced into the plasma chamber 105 during the conditioning process. In other embodiments, the co-gas may be between 20-40% of the total gas. In yet other embodiments, the co-gas may be about 30% of the total gas introduced during the conditioning process.

Figure 2:
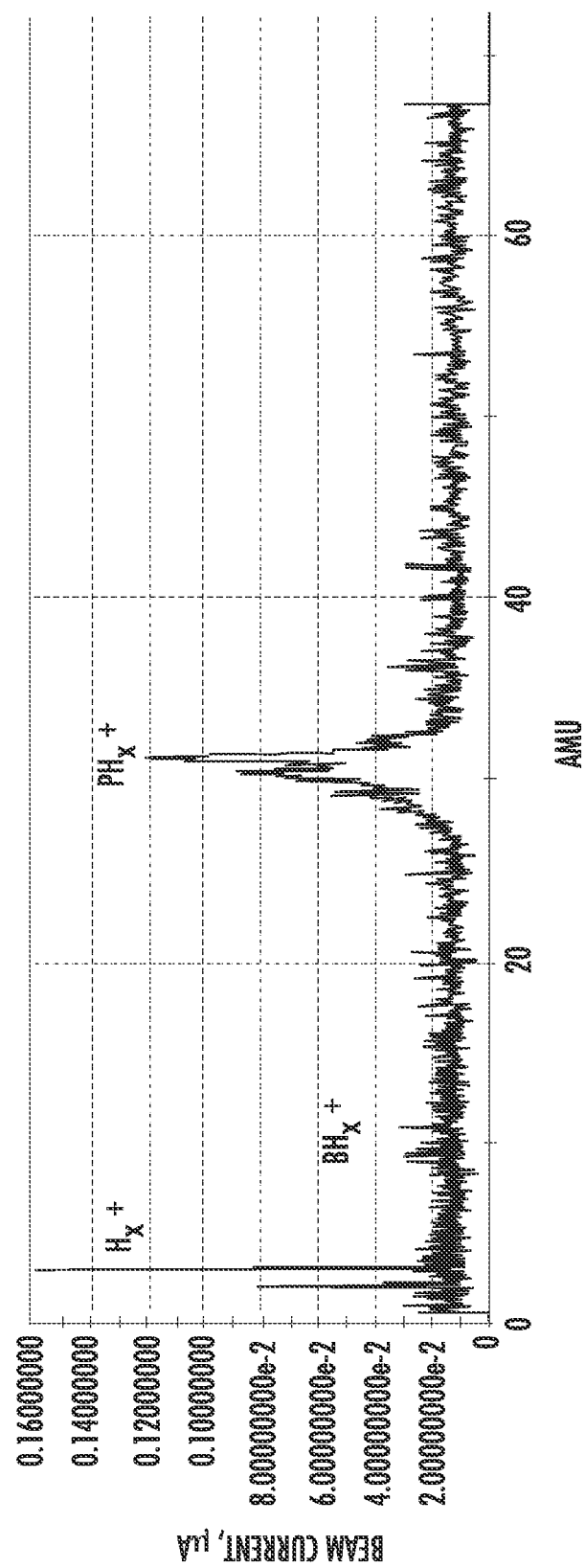
FIG. 2 is a representative graph showing ion mass spectrum during a conditioning process.

FIG. 2 shows the ion mass spectrum observed during a conditioning process using a mixture of conditioning gas and co-gas. In this figure, the conditioning gas is a mixture of 30% diborane and 70% hydrogen gas, and the co-gas is phosphine. The volume of conditioning gas is 65% of the total gas introduced. Note that the most abundant ion species are hydrogen ($H_x^+$), while the boron species is barely detectable. Hydrogen is known to etch the inner surfaces of the plasma chamber walls 107 and the dielectric window 125. A reduction in the number of hydrogen ions may be beneficial in reducing the contaminants present in the ion beam generated during the subsequent ion implantation process. Therefore, a conditioning gas that replaces some of the hydrogen gas in the conditioning gas container 175 with a filler gas, which comprises a hydride of a Group 4 or Group 5 element, may help reduce the etching of the plasma chamber walls 107.

In one specific example, $BF_3$ or $B_2F_4$ is used as the feedgas to implant the workpiece. In other words, $BF_3$ or $B_2F_4$ is disposed in feedgas container 170. Prior to the ion implantation process, the plasma chamber walls 107 of the ion source 100 are conditioned. Conditioning is performed by introducing gas from the conditioning gas container 175 to the plasma chamber 105. The conditioning gas container 175 is used to store the conditioning gas. As described above, the conditioning gas may be a combination of diborane and hydrogen gas, where roughly 30% of the total gas is diborane. In another embodiment, the conditioning gas disposed in the conditioning gas container 175 may be a mixture of diborane (up to 30%), a filler gas (10-30%) and hydrogen gas. In some embodiments, less than 60% of the conditioning gas is made up of hydrogen gas. In other embodiments, less than 50% of the conditioning gas is made up of hydrogen gas. As stated above, the filler gas is a hydride of a Group 4 or Group 5 element.

In some embodiments, gas from the third gas container 176 is also introduced during the conditioning process. As described above, the third gas container 176 is used to store the co-gas. This co-gas may be, for example, a noble gas, such as helium, argon, krypton or xenon; a Group 4 hydride, such as $SiH_4$, $Si_2H_6$ or $GeH_4$; or a Group 5 hydride, such as $PH_3$ or $AsH_3$. Of course, this list is not exhaustive and other molecules may be used as the co-gas during the conditioning process.

A plasma is generated using the conditioning gas and optionally the co-gas. In some embodiments, the voltages of the electrodes 130, 150 are such that ions are not extracted through the aperture 140. However, in other embodiments, ions from the plasma may be extracted during the conditioning process. This conditioning process serves to coat the plasma chamber walls 107 and dielectric window 125 so that impurities and other contaminants found in the plasma chamber walls 107 and the dielectric window 125 are isolated from the plasma. This coating contains the dopant found in the conditioning gas, which may be a Group 3 element, such as boron. The coating may also contain molecules found in the filler gas and in the co-gas, such as Group 4 elements, such as germanium or silicon; or Group 5 elements, such as phosphorus or arsenic. A sufficient thickness of coating may be applied. The duration of the condition procedure may be based on elapsed time, such as between 30 min and 6 hours, or may be based on measured thickness of the coating as it accumulates on the plasma chamber walls 107.

The conditioning process may be performed for between 30 min and 6 hours, although other durations of times are also possible. After the conditioning process is completed, the ion implantation process may begin.

During the ion implantation process, feedgas from the feedgas container 170 is introduced into the plasma chamber 105. As described above, this feedgas may be a molecule that contains the dopant and fluoride, such as $BF_3$ or $B_2F_4$, although other gasses may also be used. It should be noted that the dopant used in the ion implantation process may be the same as described above regarding the conditioning process. Additionally, at least one of the conditioning gas and co-gas may also be introduced to the plasma chamber 105 from its respective gas container 175, 176.

The gasses are then energized into a plasma, and extracted by applying a bias voltage to electrodes 130. The extracted ions are then directed toward a workpiece 160, where they are implanted without first being mass analyzed.

This ion implantation process is used for a plurality of workpieces 160 and may continue for a specific time period, or may be terminated when the level of contaminants in the extracted ion beam reaches a predetermined level. For example, the ion implantation process may continue until the level of contaminants reaches about 1% of the total dopant beam current, although other contamination levels may be selected.

In summary, the conditioning process utilizes gasses from the conditioning gas container 175 and optionally the third gas container 176. The ion implantation process utilizes gasses from the feedgas container 170, and gas from at least one of the conditioning gas container 175 and the third gas container 176.

The inclusion of a filler gas in the conditioning gas container 175 reduces the amount of hydrogen contained in the conditioning gas. This may reduce the amount of etching that occurs on the plasma chamber walls 107. A reduction in etching may reduce the amount of contaminants in the extracted ion beam 180 that is used in the subsequent ion implantation process. Additionally, less etching may also reduce the frequency at which the conditioning process is performed.

The inclusion of the conditioning gas or the co-gas to the feedgas during the ion implantation process may help reduce the contaminants that are extracted from the plasma chamber 105.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:
1. A method of processing a workpiece, comprising:
    performing a conditioning process, said conditioning process comprising:

storing a conditioning gas in a conditioning gas container, the conditioning gas comprising a hydride containing a desired dopant species and a filler gas, the filler gas comprising a hydride of a Group 4 element or a hydride of a species having an opposite conductivity of said dopant species;

introducing said conditioning gas into a plasma chamber of an ion source from said conditioning gas container through a gas inlet in communication with said conditioning gas container and said plasma chamber; and ionizing said conditioning gas in said plasma chamber so as to form a coating on walls of said plasma chamber; and performing an ion implantation process after said conditioning process, said ion implantation process comprising:

introducing a feedgas into said plasma chamber from a feedgas container after said coating is formed, said feedgas container different from said conditioning gas container, said feedgas comprising fluorine and said desired dopant species;

ionizing said feedgas in said plasma chamber to create ions; and extracting said ions from said plasma chamber and accelerating said ions toward said workpiece, such that said ions are implanted into said workpiece without mass analysis.

2. The method of claim 1, wherein said desired dopant species comprises boron.

3. The method of claim 2, wherein said hydride containing a desired dopant species comprises diborane.

4. The method of claim 2, wherein said filler gas comprises a hydride of a Group 5 element.

5. The method of claim 1, wherein said conditioning gas disposed in said conditioning gas container further comprises hydrogen gas.

6. The method of claim 5, wherein less than 50% of said conditioning gas disposed in said conditioning gas container comprises hydrogen gas.

7. The method of claim 1, further comprising introducing a co-gas disposed in a third gas container into said plasma chamber during said conditioning process, wherein said co-gas comprises a noble gas, a hydride of a Group 4 element or a hydride of a species having an opposite conductivity of said desired dopant species.

8. The method of claim 1, further comprising introducing a co-gas disposed in a third gas container into said plasma chamber during said ion implantation process, wherein said co-gas comprises a noble gas, a hydride of a Group 4 element or a hydride of a species having an opposite conductivity of said desired dopant species.

9. A method of processing a workpiece, comprising:

performing a conditioning process, said conditioning process comprising:

storing a conditioning gas in a conditioning gas container, the conditioning gas comprising a borane and a filler gas, where said filler gas comprises a hydride of a Group 4 element or a hydride of a Group 5 element;

introducing said conditioning gas into a plasma chamber of an ion source from said conditioning gas container through a gas inlet in communication with said conditioning gas container and said plasma chamber; and ionizing said conditioning gas in said plasma chamber so as to form a coating on walls of said plasma chamber, wherein said coating comprises boron and said Group 4 or 5 element; and performing an ion implantation process after said conditioning process, said ion implantation process comprising:

introducing a feedgas into said plasma chamber from a feedgas container after said coating is formed, said feedgas container different from said conditioning gas container, said feedgas comprising fluorine and boron;

ionizing said feedgas in said plasma chamber to create ions; and extracting said ions from said plasma chamber and accelerating said ions toward said workpiece.

10. The method of claim 9, wherein said ions are implanted into said workpiece without mass analysis.

11. The method of claim 9, wherein said conditioning gas disposed in said conditioning gas container further comprises hydrogen gas.

12. The method of claim 11, wherein less than 50% of said conditioning gas disposed in said conditioning gas container comprises hydrogen gas.

13. The method of claim 9, further comprising introducing a co-gas disposed in a third gas container into said plasma chamber during said conditioning process, wherein said co-gas comprises a noble gas, a hydride of a Group 4 element or a hydride of a Group 5 element.

14. The method of claim 9, further comprising introducing a co-gas disposed in a third gas container into said plasma chamber during said ion implantation process, wherein said co-gas comprises a noble gas, a hydride of a Group 4 element or a hydride of a Group 5 element.

15. The method of claim 1, wherein the feedgas is introduced to the plasma chamber via a second gas inlet, different from the gas inlet, wherein the second gas inlet is in communication with said feedgas container and said plasma chamber.

16. The method of claim 1, wherein the feedgas container is in communication with the gas inlet.

* * * * *